United States Patent
Ausschnitt et al.

(10) Patent No.: US 6,869,739 B1
(45) Date of Patent: Mar. 22, 2005

(54) INTEGRATED LITHOGRAPHIC PRINT AND DETECTION MODEL FOR OPTICAL CD

(75) Inventors: Christopher P. Ausschnitt, Lexington, MA (US); Ronald L. Gordon, Poughkeepsie, NY (US); Christopher J. Progler, Plano, TX (US); Alan E. Rosenbluth, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 10/353,900

(22) Filed: Jan. 28, 2003

(51) Int. Cl.⁷ .................................................. G03F 9/00
(52) U.S. Cl. ............................................ 430/30; 716/21
(58) Field of Search ................................ 430/30; 716/21

(56) References Cited

U.S. PATENT DOCUMENTS

| | | | |
|---|---|---|---|
| 6,130,750 A | 10/2000 | Ausschnitt et al. | 356/401 |
| 6,183,919 B1 | 2/2001 | Ausschnitt et al. | 430/30 |
| 2001/0001900 A1 | 5/2001 | Pogge et al. | |
| 2002/0097399 A1 | 7/2002 | Ausschnitt et al. | |

*Primary Examiner*—Christopher G. Young
(74) *Attorney, Agent, or Firm*—DeLio & Peterson, LLC; Peter W. Peterson; Steven A. Capella

(57) ABSTRACT

A method of modeling dose and focus response in lithographic imaging to simulate an optical critical dimension (OCD) metrology system creates simulated aerial images of the object pattern to be transferred to a resist film on the substrate at different focus settings of the metrology imaging system. The method then successively creates simulated images, at different exposure dose and focus settings of the metrology imaging system, of the latent and developed image of the object pattern in the resist film on the substrate, and the etched image of the object pattern in the substrate. The method converts the simulated images into polygons having more than four sides and determines the Fourier spectrum of the polygons simulating the images of the object pattern. Using the spectrum of the polygons simulating the images of the object pattern, the method then creates simulated aerial images of the object pattern developed in the resist film, at different dose and focus settings, as viewed by the OCD metrology system.

21 Claims, 12 Drawing Sheets

F=0 nm

F=75 nm

F=150 nm

CLEAR FIELD MASK

OPAQUE FIELD MASK

CLEAR FIELD MASK

OPAQUE FIELD MASK

CLEAR FIELD MASK

OPAQUE FIELD MASK

ZEROTH ORDER INTENSITY

FIRST ORDER INTENSITY

INTEGRATED LITHOGRAPHIC PRINT AND DETECTION MODEL FOR OPTICAL CD

BACKGROUND OF THE INVENTION

1. Field of the Invention

This invention relates to lithographic processing of microelectronics products and, in particular, to a method and system for simulating an optical critical dimension metrology system used to evaluate the effects of dose and focus during lithographic processing

2. Description of Related Art

Lithographic processing to produce microelectronic circuits on semiconductor wafers requires, among other things, optimization of exposure dose and focus of the energy source used to expose the mast films. An optical critical dimension (OCD) metrology system evaluates dose and/or focus response in a lithographic imaging system by measuring the changes in a printed target, for example, the length of printed lines, in a focus/dose matrix.

Conventional lithography simulators are designed to model the imaging of manhattan-type mask patterns onto the wafer. It has been found that conventional lithography simulators are inadequate in modeling an OCD metrology system because of their inability to treat the complicated shapes represented by the contours of the printed lines. Further, conventional simulation methods represent targets and their printed images as thresholded bitmaps. This quantization hinders the process of design refinement, because it becomes harder to achieve convergence during optimization of the shapes when the model response exhibits discontinuities that are not present in the physical system. While more sophisticated simulators attempt to deal with more complex shapes such as polygons, their treatment of the polygons involves breaking them down into simpler shapes such as rectangles and triangles, which is not fully satisfactory. Additionally, it is believed that the computational cost of deploying a solution tied to these simulators would be very high.

Accordingly, there is a need for simulation of an OCD metrology system in order to explain certain unexpected behaviors, as well as assist in designing targets that best monitor dose/focus response of the features that arise in the various levels of a chip.

SUMMARY OF THE INVENTION

Bearing in mind the problems and deficiencies of the prior art, it is therefore an object of the present invention to provide a method and system for simulating an OCD metrology system.

It is another object of the present invention to provide a model for an OCD metrology system that is able to handle satisfactorily complex shapes of targets, such as polygons.

It is yet another object of the present invention to provide a model for an OCD metrology system in a stand-alone package that is both flexible and accurate.

The above and other objects and advantages, which will be apparent to one of skill in the aft, are achieved in the present invention which is directed to, in a first aspect, a method of modeling dose and focus response in lithographic imaging to simulate an optical critical dimension (OCD) metrology system comprising first providing a pattern of an object to be lithographically printed on a substrate. Using imaging conditions to be employed in a metrology imaging system, there are then created simulated aerial images of the object pattern to be transferred to a resist film on the substrate at different focus settings of the metrology imaging system. The method then creates simulated images, at different exposure dose and focus settings of the metrology imaging system, of i) the latent image of the object pattern in the resist film on the substrate, ii) the developed image of the object pattern in the resist film on the substrate, and/or iii) the etched image of the object pattern in the substrate. The method converts the simulated images of the latent image, developed image, or etched image of the object pattern at different exposure dose and focus settings to polygons having more than four sides and determines the Fourier spectrum of the polygons simulating the images of the object pattern at different exposure dose and focus settings. Using the spectrum of the polygons simulating the images of the object pattern, the method then creates simulated aerial images of the object pattern developed in the resist film, at different dose and focus settings, as viewed by the OCD metrology system and evaluates critical characteristics of the simulated object pattern viewed by the OCD metrology system.

Preferably, the simulated aerial images comprise intensity contours of the object pattern to be transferred to the resist film. The contours of the object pattern to be transferred to the resist film have an inside and an outside, and the difference in reflectance between the inside and outside of the contours may be used to determine the Fourier spectrum of the polygons.

In another aspect, the present invention is directed to an article of manufacture comprising a computer usable medium having computer readable program code means for modeling dose and focus response in lithographic imaging to simulate an optical critical dimension (OCD) metrology system embodying the method steps described above.

The present invention is directed in a further aspect to a program storage device readable by a machine, tangibly embodying a program of instructions executable by the machine to perform method steps for modeling dose and focus response in lithographic imaging to simulate an optical critical dimension (OCD) metrology system, the method steps comprising those described above.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
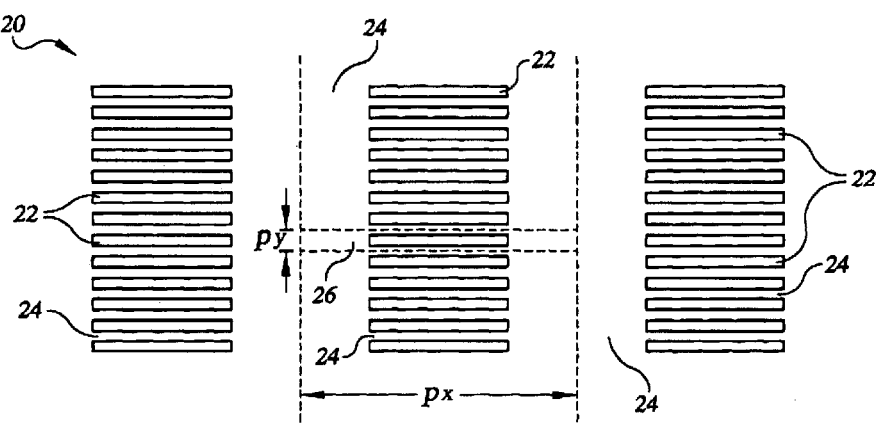
FIG. 1 is a plan view of an input mask pattern or array for a target used to monitor lithography processing of microelectronic circuits.
Figure 2:
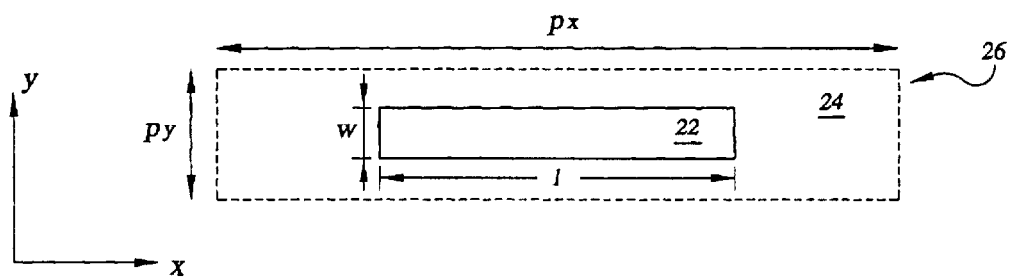
FIG. 2 is a plan view of a unit periodic cell or object used to create the pattern or array of FIG. 1.

In describing the preferred embodiment of the present invention, reference will be made herein to FIGS. 1–17 of the drawings in which like numerals refer to like features of the invention. Features of the invention are not necessarily shown to scale in the drawings.

Optical metrology systems used to monitor exposure and dose, as well as other lithographic parameters, have been disclosed in the prior art, for example the bright field system disclosed in U.S. Pat. No. 6,130,750 (see FIG. 22) and the dark field system disclosed in U.S. Pat. No. 6,183,919 (see FIGS. 3A and 3B). The disclosures of these patents are hereby incorporated by reference. The present invention provides a more accurate physical model of an optical critical dimension (OCD) metrology system in a method and system that may be employed in a stand-alone software package. The model preferably works in essentially two stages. In the first stage, the aerial image intensity of the desired object, i.e., the target, is computed through focus. From here, separate threshold, or dose, levels may be evaluated for each defocused image of the object, resulting in a distinct contour shape for a particular dose/defocus value. If a resist model is desired, then one can be inserted at this stage. The second stage takes the resultant contours at each dose/focus value and uses them as input into another simulation. This time, however, the input may be determined from the reflectivities of the stacks inside and outside the contours. Additionally, each contour itself is broken down into sample points determined by the sampling of the original aerial, resist, or final etch image. These points then become the vertices of a polygon. Provided that the sampling of the image is sufficient, then the polygon will be an accurate representation of such a contour. Such a polygon representation of the contour may be employed because of a novel algorithm that computes the exact Fourier spectrum of a polygonal region. The aerial image of this unusual shape is then easily computed, and the OCD image is a scan, or average, of the resultant image across its pitch. Thus, the present invention provides a fully integrated model of the OCD process, including polygon extraction, spectral determination, and detection.

FIG. 1 shows a typical input mask pattern 20 for a target used to monitor lithography processing of microelectronic circuits. Other target patterns can be used, such as any employed in the prior art, for example, those disclosed in U.S. Pat. Nos. 6,137,578 and 6,128,089, the disclosures of which are hereby incorporated by reference. Target pattern 20 is made up of an array of a plurality of unit periodic cells or objects 26, shown in close-up in FIG. 2. Cell 26 has a pitch $p_x$ in the x-direction and a smaller pitch $p_y$ in the y-direction. The target pattern is defined in the code employed to create the mask, and can be either binary dark- or bright-field, or phase shifted. Cell 26 is made up of a line 22, in the form of a rectangle, surrounded by a space 24, also in the form of a rectangle, representing the complement of the line. The line 22 may be dark with the surrounding space 24 clear (as in FIG. 1), or vice versa, with the line clear and the surrounding space dark. Line 22 has width w (in the y-direction) and length l (in the x-direction). These periodic cells 26 may be repeated, in the x- and y-directions, so that the spaces are connected seamlessly, as shown in FIG. 1.

Figure 3:
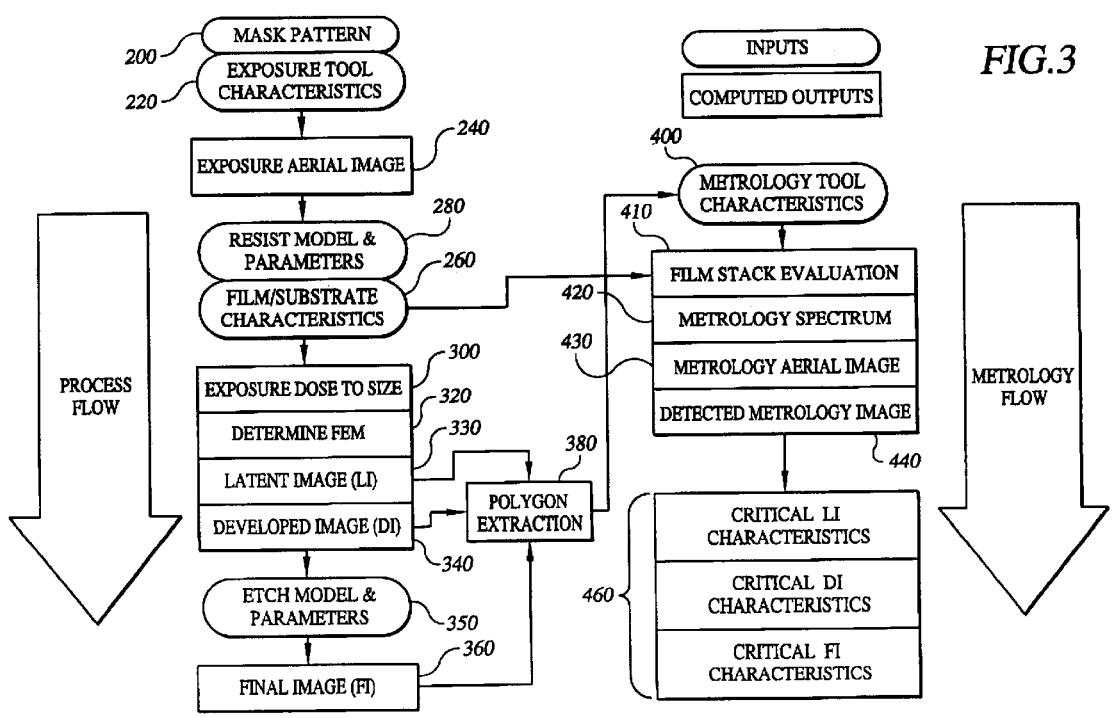
FIG. 3 is a flow chart showing the preferred steps in the method for simulating an optical critical dimension metrology system of the present invention.

FIG. 3 shows the flow chart depicting the preferred method of the present invention. After inputting the desired mask pattern to be analyzed, step 200, the exposure conditions are input into the model, step 220. These comprise the illumination conditions of the exposure tool which is being simulated. The energy or illumination source may be a radiation source that emits radiation inside or outside of the human visible spectrum, and is typically a beam of light. As exemplified in this invention, this energy source is used to expose a layer or film of a photoresist composition on a semiconductor substrate with a desired image created by a mask pattern. The aerial image of the mask pattern is transferred by modulated light or other energy to the resist film, and creates a latent image therein.

The exposure tool illumination conditions may comprise the numerical aperture (NA), the partial coherence ($\sigma$), the wavelength ($\lambda$) of the beam, the demagnification (R) of the tool, and the degree of polarization (P), which simulates the vector nature of the light. The model takes the mask pattern and simulates illumination with these parameters, in accordance with settings on the stepper employed. For example, a typical illumination condition may be:

NA=0.8

σ=0.6

λ=193.37 nm

R=1.0

P=0.5, i.e., 50% transverse electric (TE), 50% transverse magnetic (TM)

The model also simulates the known or expected focus range to be encountered. For example, the resist surface may be defocused 0.2 μm in either direction, as a result of uncertainties in the process such as wafer to wafer flatness, focus tolerances, size of separate lens, and the like.

Figure 4A:
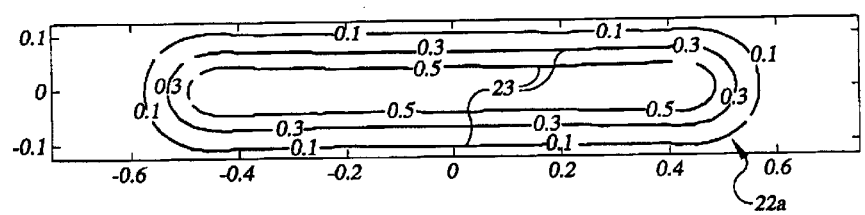
FIGS. 4a, 4b and 4c are plan views of intensity contours of aerial images of the mask pattern of FIG. 2 at different distances from the focal plane.
Figure 4B:
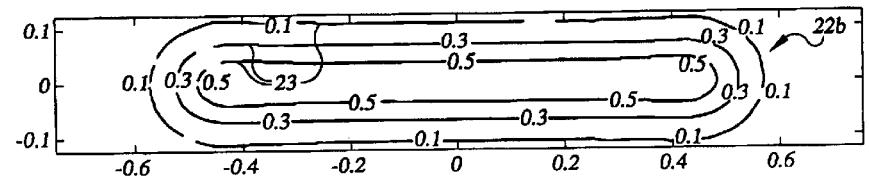
Figure 4C:
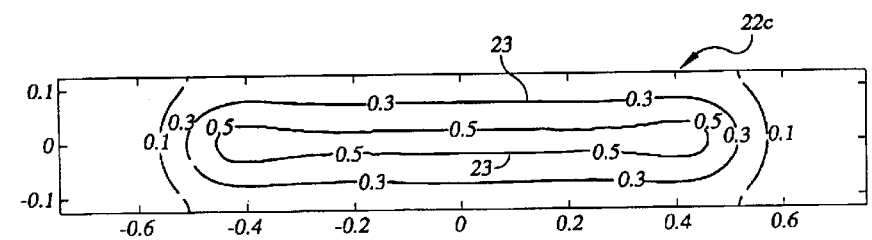

The next preferred step in the process is 240, compute optical images, wherein known optical models are used to determine the image of the mask pattern at various focus settings in air. All of the aforementioned inputs are used to create a set of contours of mask object pattern 22 at different focus settings. As shown in FIGS. 4a, 4b and 4c, the contours of intensity of the aerial image of the mask pattern 22 are shown at different distances from the focal plane, 0 nm, 75 nm and 150 nm, respectively. Intensity contours at different distance from the focal plane in the opposite direction may also be calculated. Each aerial image 22a, 22b, 22c has intensity contours 23 which are created as the object pattern 22 becomes blurred because of the system optics. The optics act as a low pass filter to filter out some of the higher spatial frequencies, tending to round out the object pattern corners. As the image gets more out of focus, it is increasingly blurred. The numbers on the x- and y-axes of FIGS. 4a –4c represent the physical size of the image, in microns.

Following computation of optical images, step 260 (FIG. 3) inputs the parameters for the substrate below the resist layer, i.e., the bottom of the film stack, onto which the targets are to be developed. The resist film is not suspended in air, but instead sits on top of a substrate such as a wafer of silica. As the illumination beam strikes into the resist film, it also travels down and strikes the substrate. The nature of the substrate will determine the degree of back-reflected light, e.g., standing waves of multiple reflections and other optical effects from the beam hitting substrate layers of different composition, thickness and refracted index. The film can even be air in a threshold model. In some instances, the substrate film may be modeled as infinitely thick single film or even air, for a less precise computation the latter by ignoring the substrate and simply selecting a desired contour from step 240. Ignoring the substrate is possible because, for instance, of the post-exposure bake process, which causes diffusion of the photoactive material in the resist and washes away the standing waves caused by the back reflection off the substrate.

In the lithographic process, when the aerial image of the object pattern strikes, the resist, the resulting latent image of the object pattern marks the volume of resist material that either is removed during the development process (positive photoresist), or that remains after development (negative photoresist). The exposure, or dose, of the energy beam, and the focus of the beam, are the variables that control the contour of the latent image on the photoresist film. The dose is set by the time and intensity of illumination of the beam, and the focus is set by the position, of the photoresist film relative to the focal plane of the imaging system. Target patterns, such as pattern 20 (Fig. 1), monitor the resolution limit of the system, as well as other variables in lithographic processing. The resolution limit determines the minimum feature size resolvable, for example the width w of line 22 (FIG. 2), and it is the simulation of this critical dimension that is of particular importance in the present invention.

In another preferred step 280 (FIG. 3), which may be before or after step 260, the model of the resist film layer(s) is input, to convert the latent image in the resist film into the developed contours or resist profile, as would occur during processing. The resist model can take several forms known in the art, such as a multi-parameter, reaction-diffusion, full develop model, a lumped-parameter model, a variable threshold model, or a constant threshold model. The example herein uses a constant threshold model. This provides a real resist profile by modeling how the resist gets removed, as a function of time, during development of the latent image.

Following input of the resist model, the next step 300 computes dose of the illumination beam and converts it to the resulting size of the object in the resist, after development. In other words, the exposure dose and threshold level are determined that results in the desired line width w (FIG. 2) on the substrate with the given resist model. Given the concentration of photoactive material, a certain exposure dose level, upon development, will contract or expand the resist profile. The physical contours in the resist profile match the aerial or latent image contours at different dose values. For example, if the line width of the developed object in the resist layer is to be a particular width, the exposure dose and threshold level are determined that will result in that width. The exposure dose is the physical amount of light that is the input into the resist model, i.e., the average energy in the latent image, and the threshold is the value of local energy in the image at which the resist either remains or is removed during development. Thus, the threshold determines what that local value of energy is at any point in the resist.

Subsequently, step 320 determines the focus/exposure matrix (FEM) based on variations in dose and focus of the system being simulated. Once the nominal dose has been determined and the focal range is set, then the FEM can be set, for example, by setting the following focus and dose values:

Focus: −150 nm, −75 nm, 0 nm, 75 nm, and 150 nm

Dose: 85%, 93%, 100%. 107% and 115% of threshold that gives 125 nm line width in air.

Nominal threshold dose ~0.34 (normalized to a clear space)

Figure 5:
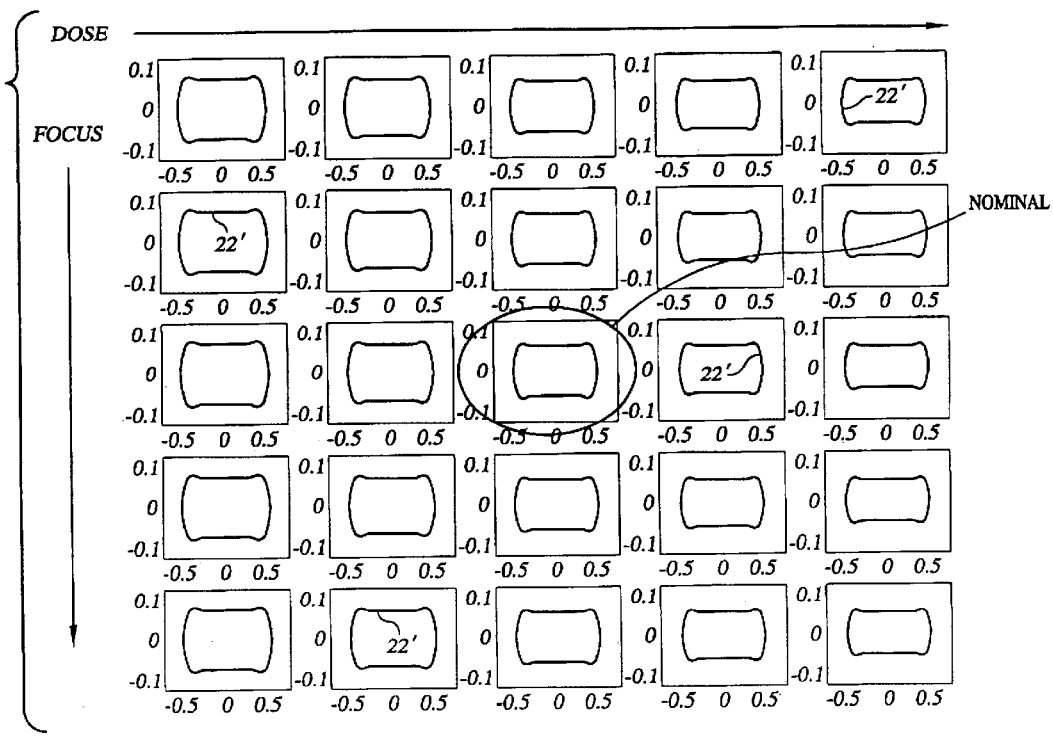
FIG. 5 is a matrix, for different combinations of dose and focus, of the simulated configuration of the object of Fig. 2 in the developed resist film on the substrate.
Figure 6:
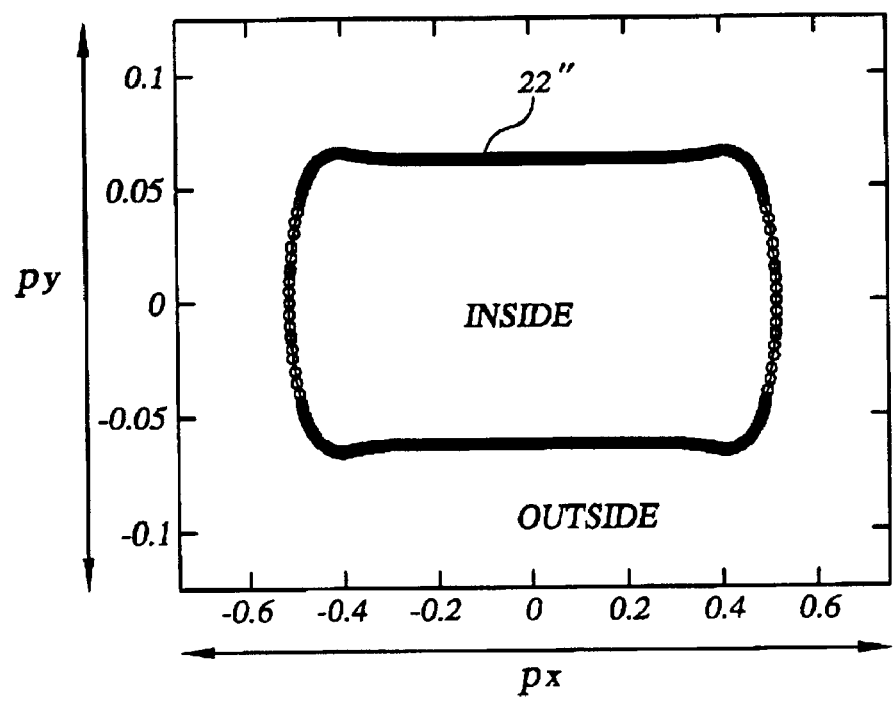
FIG. 6 is the simulated outline of the object of FIG. 2 in the developed resist film on the substrate of a wafer at the dose that replicates the nominal feature width of the mask and the optimum focus.

From the FEM, step 330 (FIG. 3) generates the latent image (LI) in the resist layers using distribution of light or photoactive compounds in the resist layer. Thereafter, for more precise modeling, one may apply an empirical develop model (such as the Weiss or Mack models) or employ a Lumped-Parameter model (LPM), such as that of Brunner-Ferguson in step 340 to generate the developed image (DI) pattern of the object in the developed resist layers on the substrate for the dose/exposure matrix determined in step 320. This matrix is shown in FIG. 5, wherein the range of different focus values is varied in the y-direction, and the range of different dose values is varied in the x-direction. For each particular combination of dose and focus, the configuration 22' of the object 22 (FIG. 2) is shown in the developed resist film on the substrate. Again, the size of the object 22' is indicated in microns on the x- and y-axes of the individual dose and focus combinations. The nominal dose/ focus (0 nm focus, 100% dose) pattern is shown in the center. If only the latent image of the object is employed in the model, there is created a similar matrix of the LI object contour pattern configuration, varying the dose and focus values.

For even more precise modeling, following input of the etch model and etch parameters, step 350, there may then be generated in step 360 the contour pattern of the object etched in the substrate for the dose/exposure matrix determined in step 320. The etched, final image (FI) may be determined from the DI by any well-known etch model known in the art. Again, a matrix of the FI object configuration, varying the dose and focus values, is created in a manner similar to that described above.

For each object resist/substrate contour computed in the matrix created in steps 330, 340 or 350, a polygon extraction step 380 (FIG. 3) is then performed to determine a sampling of points along that contour. This may be done from within any known plotting application. (If this is determined from a picture, e.g. a SEM photomicrograph, then an edge detection and shift algorithm can determine these points along the contour.)

The polygon extraction is performed by taking each contour from the matrix, which contour is essentially a set of points, and having the points correspond to vertices of a polygon. To create a more accurate simulation, each polygon is preferably created with more than four points (more typically, on the order of 1000 points), and an algorithm is used to determine the Fourier spectrum of the polygon just in terms of the vertices of the polygons. In doing so, the algorithm determines the inside and outside to every polygon 22" (see FIG. 6), to create an observable image of a real pattern layer.

Since the extracted polygon is an element in a periodic target structure, it can be represented by the Fourier Series:

$$m(x, y) = \sum_{m=-\infty}^{\infty} \sum_{n=-\infty}^{\infty} M\left(\frac{m}{P_x}, \frac{n}{P_y}\right) \exp\left[-i2\pi\left(m\frac{x}{P_x} + n\frac{y}{P_y}\right)\right] \quad (1)$$

where m(x,y) is the polygon and $M(f_x,f_y)$ is the polygon spectrum. In the case where the amplitude of the inside of the polygon is 1 and the outside is 0, corresponding to a dark field binary mask, the spectrum $M_D(f_x,f_y)$ of an arbitrary polygon with N vertices with coordinates (xj,yj), where j=[1:N] is given by: (Note that (x_[N+1],y_[N1])=(x_1, y_1).)

$$M_D(f_x, f_y) = \begin{cases} -\frac{1}{i2\pi(f_x^2 + f_y^2)} \sum_{j=1}^{N} [f_y(x_{j+1} - x_j) - f_x(y_{j+1} - y_j)] \exp[i\pi(f_x(x_{j+1} + x_j) + f_y(y_{j+1} + y_j))] \times \underset{j}{\max}\{[f_xx_j + f_yy_j]\} > \sqrt{\varepsilon} \\ \operatorname{sinc}[\pi(f_x(x_{j+1} + x_j) + f_y(y_{j+1} - y_j))] \\ \frac{1}{2}\sum_{j=1}^{N} (x_jy_{j+1} - x_{j+1} - x_{j+1}y_j)\left[1 + i\pi\frac{2}{3}(f_x(x_{j+1} + x_j) + f_y(y_{j+1} + y_j))\right], \quad \underset{j}{\max}\{[f_xx_j + f_yy_j]\} < \sqrt{\varepsilon} \end{cases} \quad (2)$$

For a target comprised of a finite number of pitches (J,K) in the x- and y-directions, Equation (1) is multiplied by the rectangular functions:

$$rect\left(\frac{x}{Jp_x}\right)rect\left(\frac{x}{Kp_y}\right)$$

and the spectrum of Equation (2) is convolved with:
$JKp_xp_y\operatorname{sinc}(Jp_xf_x)\operatorname{sinc}(Kp_yf_y)$ As shown in FIG. 3, the extracted polygon spectrum 380 acts as the critical link between the simulated process now on the left and the simulated metrology flow on the right.

Of primary importance to simulating the performance of an optical metrology system is the difference in reflectance between the inside and the outside of the contour under the metrology illumination conditions. As shown in the flow-chart of FIG. 3, this requires the input of the substrate and file stack parameters (film thickness and refractive index at the metrology wavelengths) as well as the metrology illumination characteristics (wavelength and coherence).

Figure 7:
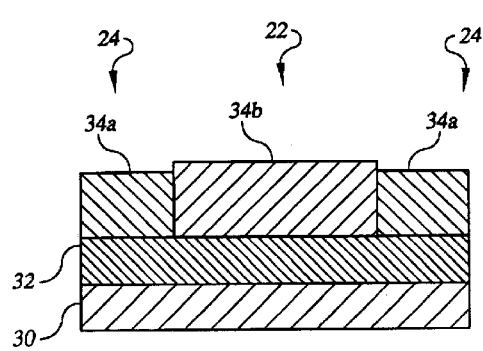
FIG. 7 is the cross-sectional view of the object of FIG. 2 in the undeveloped resist film on the substrate in the case where the latent image (LI) is formed by exposing a positive resist in the area surrounding the pattern.
Figure 8:
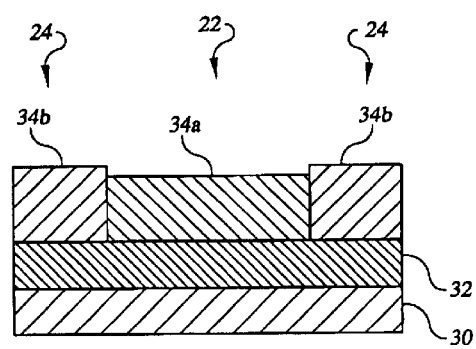
FIG. 8 is the cross-sectional view of the object of FIG. 2 in the undeveloped resist film on the substrate in the case where the latent image (LI) is formed by exposing a positive resist within the area of the pattern.
Figure 9:
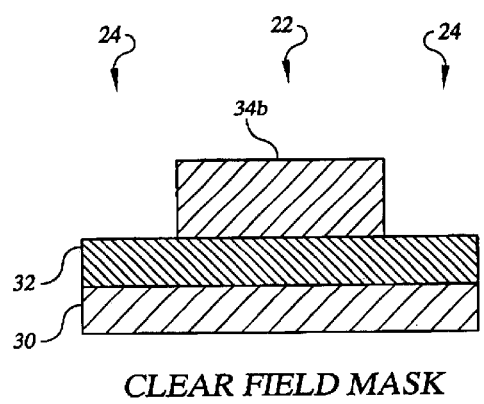
FIG. 9 is the cross-sectional view of the object of FIG. 2 in the developed resist film on the substrate in the case where the developed image (DI) is formed by clearing the resist from the area surrounding the pattern.
Figure 10:
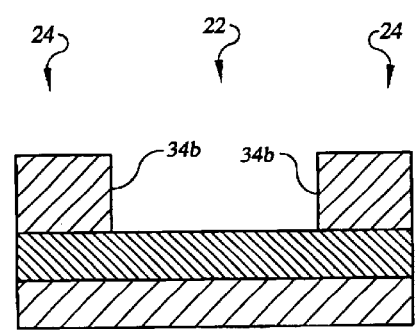
FIG. 10 is the cross-sectional view of the object of FIG. 2 in the developed resist film on the substrate in the case where the developed image (DI) is formed by clearing the resist within the area of the pattern.
Figure 11:
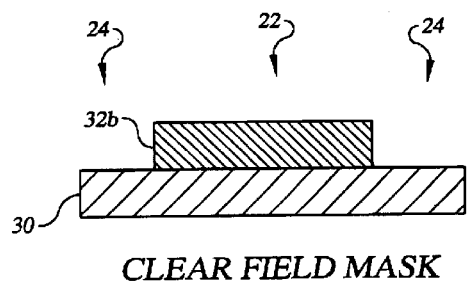
FIG. 11 is the cross-sectional view of the object of FIG. 2 after it has been etched into the top layer of the substrate in the case where the final image (FI) is formed by clearing the film from the area surrounding the pattern.
Figure 12:
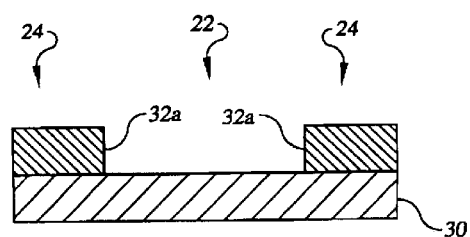
FIG. 12 is the cross-sectional view of the object of FIG. 2 after it has been etched into the top layer of the substrate in the case where the final image (FI) is formed by etching the film within the area of the pattern.

Depending on parity of the original mask (i.e., bright- or dark-field), the inside or outside of the polygon contour is "exposed", "developed"and/or "etched" in the model to form the latent, developed and final images respectively. In the case of the latent image, exposed resist regions exhibit reflectance different from unexposed regions, in some cases only following a post-exposure bake. FIGS. 7–12 show a wafer substrate 30, layer 32 to be etched, and the overlying positive resist layer 34 in cross-section across the pitch $p_y$ of object cell 26 (FIG. 2) made up of line 22 and surrounding space 24. FIGS. 7 and 8 show the undeveloped, latent image of cell 26 in the resist layer, FIGS. 9 and 10 show the developed image of cell 26 in the resist layer, and FIGS. 11 and 12 show the final etched cell 26 on the wafer. FIGS. 7, 9 and 11 show these for a clear field mask and FIGS. 8, 10 and 12 show these for an opaque field mask. Thus, the difference between the inside and outside in the latent image LI is the exposed resist layer portions 34a, as shown in FIGS. 7 and 8 adjacent unexposed resist layer portions 34b. In the case of the developed image DI, the difference between the inside and outside is the presence or absence of the remaining unexposed, undeveloped resist layer portions 34b, as shown in FIGS. 9 and 10. In the case of the final or etched image FI, the difference between the inside and outside is the presence of the remaining unetched layer portion 32a, 32b or absence of the etched layer portions adjacent unetched portions 32a, 32b, as shown in FIGS. 11 and 12.

Following the polygon extraction of the object contours for the LI, DI or FI, completing the simulation of the process flow of creating the object on the water, the results are then used to simulate the viewing of the object by the OCD metrology tool. Since the OCD metrology tool being simulated has its own imaging characteristics (analogs to those of the original imaging tool), step 400 (FIG. 3) comprises inputting the characteristics of the metrology tool or microscope that is used to view the object developed and etched in the resist film.

The input film/substrate characteristics from step 260 are then used with the polygon extraction calculations of the object's LI, DI or FI in the film stack evaluation step 410. The film stack evaluation calculates the reflectivity of each layer, based on the refractive indices and thickness of each layer of the resist and substrate. The reflectivity numbers derived in the film stack evaluation am then modeled as effective mask transmission factors for next step 420, metrology spectrum calculation. To perform this, them is required the spectrum of the polygon with these transmission factors. While this is potentially a difficult problem, since numerical evaluation of Fourier integral can lead to inaccuracies, the present invention provides a relatively simple, analytical expression that determines this spectrum more precisely. The spectrum of the polygon with reflectance $R_1$ inside and $R_2$ outside, which we call the "metrology spectrum," is given by:

$$M(f\text{hd } x, f_y)_{-R2} \delta(f_x, f_y) - (R_2 - R_1))M_D(f_x, f_y) \quad (3)$$

where $$\delta(f_x, f_y) = \begin{cases} 1, & f_x^2 + f_y^2 = 0 \\ 0, & f_x^2 + f_y^2 > 0 \end{cases}$$

Figure 13:
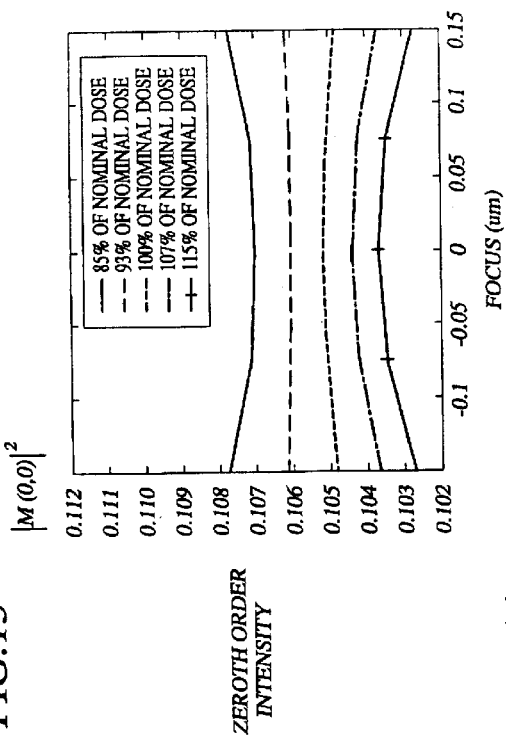
FIG. 13 is a graphical representation of the zeroth order intensity of light simulated as reflecting off a polygon contour created from the simulated object configurations of FIG. 5.
Figure 14:
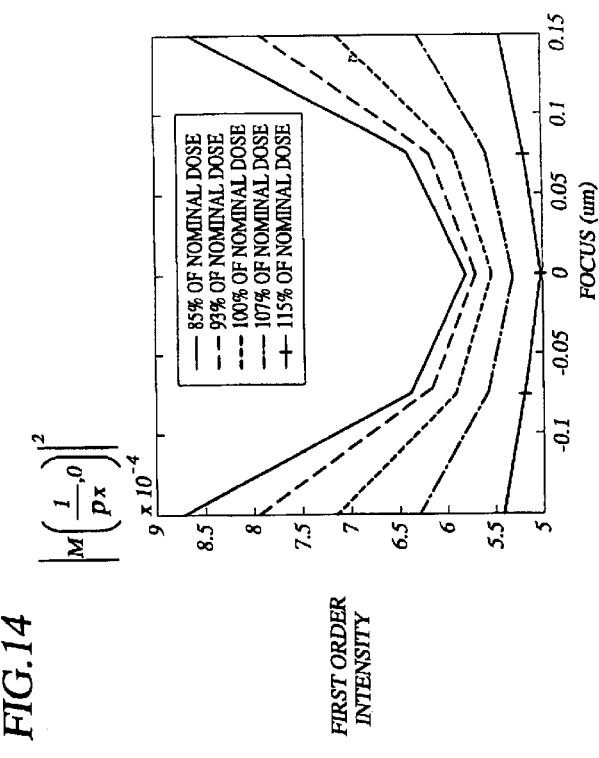
FIG. 14 is a graphical representation of the first order intensity of light simulated as reflecting off a polygon contour created from the simulated object configurations of Fig. 5.

As shown in FIGS. 13 and 14, two plots are created to show different diffracted order intensity. In FIG. 13, the zeroth order intensity is shown and in FIG. 14, the first diffracted order intensity is shown. When the light or illumination beam is simulated as reflecting off the polygon contour, which is still part of an array of a plurality of polygons, it acts as a grating. As one plane wave of the illumination beam is shone on the polygon contour, it is split into several plane waves. The zeroth order is the plane wave that is reflected straight back, with no pattern in reflected intensity. FIG. 13 shows the plot of this through the range of focus for different values of the nominal dose. The first refracted order in FIG. 14 shows the intensity of the first angle of reflected light as a result of diffraction, where some of the light will be diffracted at different angles, determined by the larger pitch, $p_\lambda$, and the wavelength.

Figure 15:
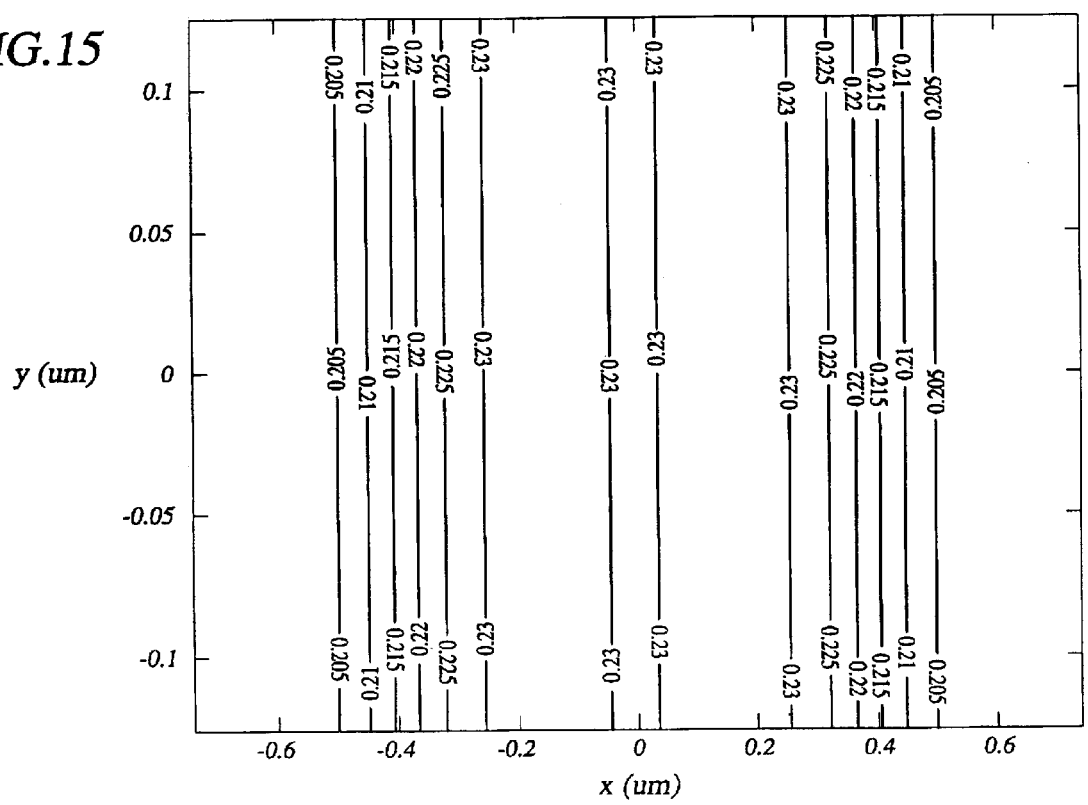
FIG. 15 is a contour representation of the simulated metrology aerial image of the object of FIG. 2 in the developed resist film across its pitch in both the x and y direction, as viewed by the microscope of an OCD metrology system.

For diffraction-based OCD metrology tools the ability to simulate the intensities of the diffracted orders from realistic printed periodic patterns is, in and of itself, a very useful output. The simulated response of the diffracted intensities to dose and focus variation enables the optimization of diffraction-based metrology for the control of the patterning process. For image-based optical metrology tools, the NA, partial coherence, light wavelength and the like for the metrology tool used to view the developed object from step 400 and the metrology spectrum calculated in step 420 are then used in step 430 to determine the metrology aerial image from the pattern reflected from the resist film, in the same way that the original aerial image was determined in step 240. The metrology aerial image contour is shown in FIG. 15, which is a contour representation of the simulated metrology aerial image of the object of FIG. 2 in the developed resist film across its pitch in both the x and y direction, as viewed by the microscope of an OCD metrology system.

Figure 16:
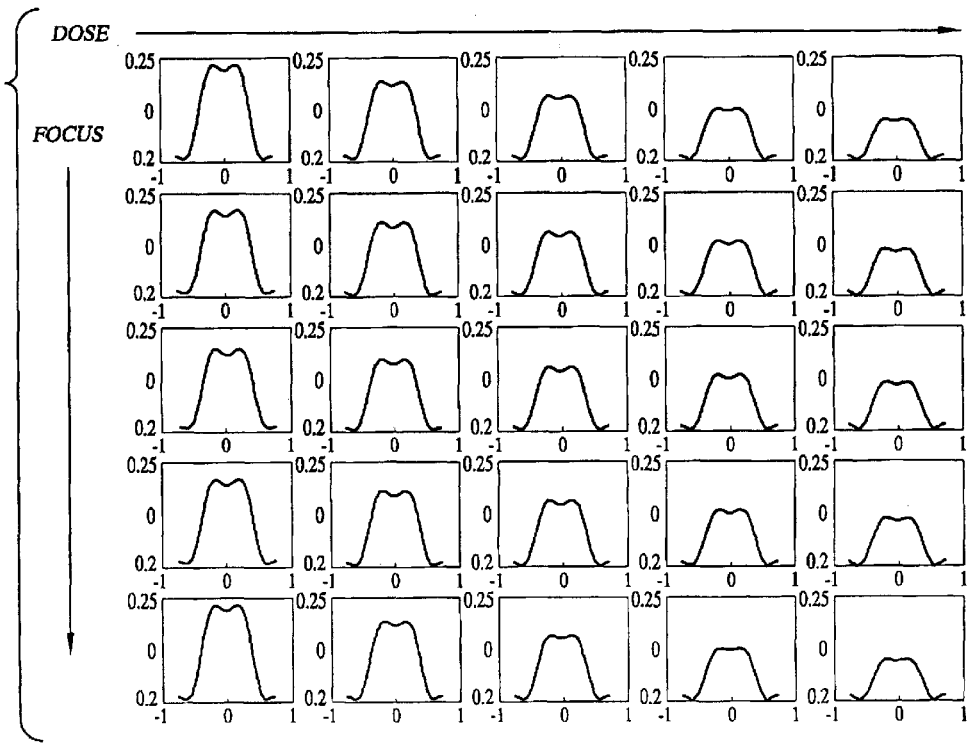
FIG. 16 is a matrix, for different combinations of dose and focus, of intensity of the image of the target object of FIG. 2 in the developed resist film across its pitch in the x direction.

Using the metrology aerial images from the previous step, the detected image is then determined in step 440. The detector averages the image intensity along the smaller pitch, $p_y$, of the target object shown in the aerial image. One can use bright field, dark-field, or reverse dark-field detection methods known in the prior art. In FIG. 16, bright field detection is used as an example to show the matrix of intensities of the image of the target object across its larger pitch, $p_x$, for the different combinations of dose and focus ranges used previously, for example in FIG. 5. The detector, as a physical device, has a finite response, meaning that it can only resolve a finite number of pixels. If the true image at the detector is I(x), and the finite-width response of the detector is r(x), then the detected image is the convolution of I and r.

Once the detected line widths are modeled, any analysis of critical characteristics that can be done on OCD tool, e.g., dose and focus response of thresholded line width, may now be performed in step 460 (FIG. 3) using the different dose and focus values simulated. There are three critical points at which the lithographic pattern can be measured. Photo-induced changes in the resist properties create the LI. The LI is characterized by differences in resist index of refraction and possibly small differences in resist thickness between the unexposed and exposed regions. The DI is formed by a chemical treatment of the LI that preferentially removes the exposed resist (positive tone) or the unexposed resist (negative tone). The DI is characterized by a cross-sectional profile separating the regions where resist has been removed from those where it remains. The FI is formed by a chemical treatment of the DI that etches underlying films preferentially with respect to the patterned resist. The resist pattern is transferred to the layers that create the electrical components of the manufactured circuit. In most cases, the remaining resist is then stripped from the newly patterned substrate. The FI is characterized by the cross-sectional profile separating the regions where the underlying films have been removed from those where they remain. In all cases—LI, DI, FI—the most important pattern characteristic is the critical dimension (CD), the distance between edge pairs that define the minimum dimension image. Other important attributes include aspect ratio (the height to width ratio), sidewall angle and top loss (the thickness of resist removed in unpatterned regions). Since dose and focus are the exposure settings that define the LI, computation of the response to dose and focus of each image attribute at each image step is an essential simulation capability.

Experimental characterization of the image attributes is laborious, and requires expensive processing equipment normally committed to manufacturing. Simulation enables the rapid exploration and optimization of the imaging process without exhaustive experimentation. Including metrology capability in the simulation is important, if not essential, to the implementation of process control. Existing simulators ar limited to either to the simulation of pattern formation on the substrate, or to the simulation of the metrology of predefined substrate patterns. The advantage of the simulator described here is its ability to compute both image formation and the metrology response in a single pass, using a novel and efficient polygon extraction method to transfer the computed substrate image to the metrology tool.

Figure 17:
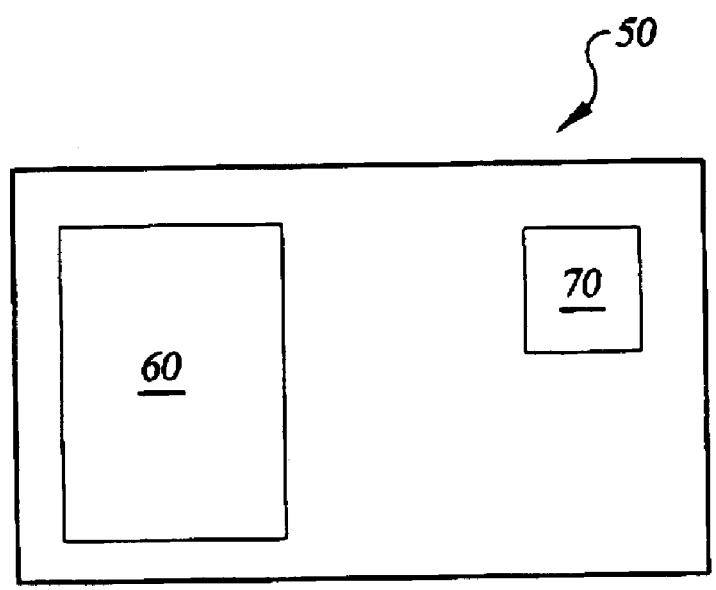
FIG. 17 is a schematic representation of the computer system in which the OCD metrology system model may be programmed.

The method of the present invention for simulating an optical critical dimension metrology system may be implemented by a computer program or software incorporating the process steps and instructions described above in otherwise conventional program code and stored on an otherwise conventional program storage device. As shown in FIG. 17, the program code, as well as any input information required, may be stored in a computer 50 on program storage device 60, such as a semiconductor chip, a read-only memory, magnetic media such as a diskette or computer hard drive, or optical media such as a CD or DVD ROM. Computer system 50 has a microprocessor 70 for reading and executing the stored program on device 60.

Thus, the model provided in the present invention may accurately simulate the creation of the target line or other object on the target mask as developed and imaged by an OCD metrology system over any variety of dose and focus conditions. In contrast to the prior art, the method of the present invention smoothly interpolate the corner coordinates in a polygonal representation of the printed feature, and the fit may be second order or higher. This assists designers in explaining various behaviors of the target image, as well as designing features that best monitor dose/focus response of the features that arise in the various levels of a chip.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any Thus, having described the invention, what is claimed is:

1. A method of modeling dose and focus response in lithographic imaging to simulate an optical critical dimension (OCD) metrology system comprising:

providing a pattern of an object to be lithographically printed on a substrate;

using imaging conditions to be employed in a metrology imaging system, creating simulated aerial images of the object pattern to be transferred to a resist film on the substrate at different focus settings of the metrology imaging system;

using characteristics of the resist film on the substrate, creating simulated images of the latent image of the object pattern in the resist film on the substrate at different exposure dose and focus settings of the metrology imaging system;

optionally, using characteristics of the latent image of the object pattern, creating simulated images of the developed image of the object pattern in the resist film on the substrate at different exposure dose and focus settings of the metrology imaging system;

optionally, using characteristics of the developed image of the object pattern, creating simulated images of the etched image of the object pattern in the substrate at different exposure dose and focus settings of the metrology imaging system;

converting the simulated images of the latent image, developed image, or etched image of the object pattern at different exposure dose and focus settings to polygons having more than four sides;

determining the Fourier spectrum of the polygons simulating the images of the object pattern at different exposure dose and focus settings;

using the spectrum of the polygons simulating the images of the object pattern, creating simulated aerial images of the object pattern developed in the resist film, at different dose and focus settings, as viewed by the OCD metrology system; and evaluating critical characteristics of the simulated object pattern viewed by the OCD metrology system.

2. The method of claim 1 wherein the simulated aerial images comprise intensity contours of the object pattern to be transferred to the resist film.

3. The method of claim 1 wherein the Fourier spectrum of the polygons simulating the images of the object pattern at different exposure dose and focus settings is created using the latent images of the object pattern on the resist film.

4. The method of claim 3 wherein the simulated aerial images comprise intensity contours of the object pattern to be transferred to the resist film.

5. The method of claim 3 wherein the contours of the object pattern to be transferred to the resist film have an inside and an outside, and wherein difference in reflectance between the inside and outside of the contours is used to determine the Fourier spectrum of the polygons simulating the latent object pattern on the resist film.

6. The method of claim 1 wherein the Fourier spectrum of the polygons simulating the images of the object pattern at different exposure dose and focus settings is created using the developed images of the object pattern on the resist film.

7. The method of claim 6 wherein the simulated aerial images comprise intensity contours of the object pattern to be transferred to the resist film.

8. The method of claim 6 wherein the contours of the object pattern to be transferred to the resist film have an inside and an outside, and wherein difference in reflectance between the inside and outside of the contours is used to determine the Fourier spectrum of the polygons simulating the developed object pattern on the resist film.

9. The method of claim 1 wherein the Fourier spectrum of the polygons simulating the images of the object pattern at different exposure dose and focus settings is created using the etched images of the object pattern on the resist film.

10. The method of claim 9 wherein the simulated aerial images comprise intensity contours of the object pattern to be transferred to the resist film.

11. The method of claim 9 wherein the contours of the object pattern to be transferred to the resist film have an inside and an outside, and wherein difference in reflectance between the inside and outside of the contours is used to determine the Fourier spectrum of the polygons simulating the etched object pattern on the resist film.

12. The method of claim 9 further including using etch characteristics of the substrate to creating the simulated images of the etched image of the object pattern in the substrate.

13. A method of modeling dose and focus response in lithographic imaging to simulate an optical critical dimension (OCD) metrology system comprising:

providing a pattern of an object to be lithographically printed on a substrate;

using imaging conditions to be employed in a metrology imaging system, creating simulated aerial images of the object pattern to be transferred to a resist film on the substrate at different focus settings of the metrology imaging system;

creating simulated images, at different exposure dose and focus settings of the metrology imaging system, of i) the latent image of the object pattern in the resist film on the substrate, ii) the developed image of the object pattern in the resist film on the substrate, or iii) the etched image of the object pattern in the substrate;

converting the simulated images of the latent image, developed image, or etched image of the object pattern at different exposure dose and focus settings to polygons having more than four sides;

determining the Fourier spectrum of the polygons simulating the images of the object pattern at different exposure dose and focus settings;

using the spectrum of the polygons simulating the images of the object pattern, creating simulated aerial images of the object pattern developed in the resist film, at different dose and focus settings, as viewed by the OCD metrology system; and evaluating critical characteristics of the simulated object pattern viewed by the OCD metrology system.

14. An article of manufacture comprising a computer usable medium having computer readable program code means embodied therein for modeling dose and focus response in lithographic imaging to simulate an optical critical dimension (OCD) metrology system, the computer readable program code means in said article of manufacture comprising:

computer readable program code means for providing a pattern of an object to be lithographically printed on a substrate;

computer readable program code means for creating simulated aerial images of the object pattern to be transferred to a resist film on the substrate at different focus settings of the metrology imaging system, using imaging conditions to be employed in a metrology imaging system;

computer readable program code means for creating simulated images, at different exposure dose and focus settings of the metrology imaging system, of i) the latent image of the object pattern in the resist film on the substrate, ii) the developed image of the object pattern in the resist film on the substrate, or iii) the etched image of the object pattern in the substrate;

computer readable program code means for converting the simulated images of the latent image, developed image, or etched image of the object pattern at different exposure dose and focus settings to polygons having more than four sides;

computer readable program code means for determining the Fourier spectrum of the polygons simulating the images of the object pattern at different exposure dose and focus settings;

computer readable program code means for using the spectrum of the polygons simulating the images of the object pattern, creating simulated aerial images of the object pattern developed in the resist film, at different dose and focus settings, as viewed by the OCD metrology system; and computer readable program code means for evaluating critical characteristics of the simulated object pattern viewed by the OCD metrology system.

15. The article of manufacture of claim 14 wherein the computer readable program code means for creating simulated images, at different exposure dose and focus settings of the metrology imaging system, is of the latent image of the object pattern in the resist film on the substrate, and wherein the computer readable program code means for converting the simulated images converts the latent image of the object pattern at different exposure dose and focus settings to polygons having more than four sides.

16. The article of manufacture of claim 14 wherein the computer readable program code means for creating simulated images, at different exposure dose and focus settings of the metrology imaging system, is of the developed image of the object pattern in the resist film on the substrate, and wherein the computer readable program code means for converting the simulated images converts the developed image of the object pattern at different exposure dose and focus settings to polygons having more than four sides.

17. The article of manufacture of claim 14 wherein the computer readable program code means for creating simulated images, at different exposure dose and focus settings of the metrology imaging system, is of the etched image of the object pattern in the substrate and wherein the computer readable program code means for converting the simulated images converts the etched image of the object pattern at different exposure dose and focus settings to polygons having more than four sides.

18. A program storage device readable by a machine, tangibly embodying a program of instructions executable by the machine to perform method steps for modeling dose and focus response in lithographic imaging to simulate an optical critical dimension (OCD) metrology system, said method steps comprising:

providing a pattern of an object to be lithographically printed on a substrate;

creating simulated aerial images of the object pattern to be transferred to a resist film on the substrate at different focus settings of the metrology imaging system, using imaging conditions to be employed in a metrology imaging system;

creating simulated images, at different exposure dose and focus settings of the metrology imaging system, of i) the latent image of the object pattern in the resist film on the substrate, ii) the developed image of the object pattern in the resist film on the substrate, or iii) the etched image of the object pattern in the substrate;

converting the simulated images of the latent image, developed image, or etched image of the object pattern at different exposure dose and focus settings to polygons having more than four sides;

determining the Fourier spectrum of the polygons simulating the images of the object pattern at different exposure dose and focus settings;

using the spectrum of the polygons simulating the images of the object pattern, creating simulated aerial images of the object pattern developed in the resist film, at different dose and focus settings, as viewed by the OCD metrology system; and evaluating critical characteristics of the simulated object pattern viewed by the OCD metrology system.

19. The program storage device of claim 18 wherein the method step of creating simulated images, at different exposure dose and focus settings of the metrology imaging system, uses the latent image of the object pattern in the resist film on the substrate, and wherein the method step of converting the simulated images converts the latent image of the object pattern at different exposure dose and focus settings to polygons having more than four sides.

20. The program storage device of claim 18 wherein the method step of creating simulated images, at different exposure dose and focus settings of the metrology imaging system, uses the developed image of the object pattern in the resist film on the substrate, and wherein the method step of converting the simulated images converts the developed image of the object pattern at different exposure dose and focus settings to polygons having more than four sides.

21. The program storage device of claim 18 wherein the method step of creating simulated images, at different expose dose and focus settings of the metrology imaging system, uses the etched image of the object pattern in the substrate and wherein the method step of converting the simulated images converts the etched image of the object pattern at different exposure dose and focus settings to polygons having more than four sides.

* * * * *